(12) United States Patent
Xu et al.

(10) Patent No.: US 10,680,009 B2
(45) Date of Patent: Jun. 9, 2020

(54) METHOD FOR FORMING GATE STRUCTURE OF THREE-DIMENSIONAL MEMORY DEVICE

(71) Applicant: Yangtze Memory Technologies Co., Ltd., Wuhan, Hubei (CN)

(72) Inventors: Qiang Xu, Hubei (CN); Zhiliang Xia, Hubei (CN); Ming Shao, Hubei (CN); Zongliang Huo, Hubei (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/047,158

(22) Filed: Jul. 27, 2018

(65) Prior Publication Data

US 2019/0067323 A1 Feb. 28, 2019

Related U.S. Application Data

(63) Continuation of application No. PCT/CN2018/089839, filed on Jun. 4, 2018.

(30) Foreign Application Priority Data

Aug. 23, 2017 (CN) .......................... 2017 1 0729505

(51) Int. Cl.
*H01L 29/792* (2006.01)
*H01L 27/11582* (2017.01)
(Continued)

(52) U.S. Cl.
CPC .... *H01L 27/11582* (2013.01); *H01L 27/1157* (2013.01); *H01L 27/11568* (2013.01); *H01L 29/66833* (2013.01)

(58) Field of Classification Search
None
See application file for complete search history.

(56) References Cited

U.S. PATENT DOCUMENTS 10,103,160 B2   10/2018  Jayanti et al.
10,141,322 B2   11/2018  Simsek-Ege et al.
(Continued)

FOREIGN PATENT DOCUMENTS

CN   104241204 A   12/2014
CN   105493266 A   4/2016
(Continued)

OTHER PUBLICATIONS

International Search Report and Written Opinion of the International Searching Authority directed to related International Patent Application No. PCT/CN2018/089839, dated Sep. 5, 2018; 8 pages.

*Primary Examiner* — Calvin Y Choi
(74) *Attorney, Agent, or Firm* — Sterne, Kessler, Goldstein & Fox P.L.L.C.

(57) ABSTRACT

A method for forming a gate structure of a 3D memory device is provided. The method comprises: forming an alternating dielectric stack on a substrate; forming multiple slits, each penetrating vertically through the alternating dielectric stack and extending in a horizontal direction; removing multiple sacrificial layers in the alternating dielectric stack through the plurality of slits to form multiple trenches; forming a conductive layer in each of the trenches; forming a first isolation layer on sidewalls of the slits to cover the conductive layers to prevent the conductive layers from being oxidized; forming a second isolation layer on surfaces of the first isolation layer, a material of the second isolation layer being different from a material of the first isolation layer; and depositing a conductive material into the slits to form multiple conductive walls, the conductive walls are insulated from the conductive layers.

20 Claims, 6 Drawing Sheets

(51) Int. Cl.
*H01L 29/66* (2006.01)
*H01L 27/11568* (2017.01)
*H01L 27/1157* (2017.01)

(56) References Cited

U.S. PATENT DOCUMENTS

2016/0293618 A1    10/2016  Namkoong et al.
2017/0062472 A1*    3/2017  Park .................. H01L 27/11582
2017/0236831 A1     8/2017  Kim

FOREIGN PATENT DOCUMENTS

| | | |
|---|---|---|
| CN | 105679761 A | 6/2016 |
| CN | 106024794 A | 10/2016 |
| CN | 106104803 A | 11/2016 |
| CN | 106847820 A | 6/2017 |
| CN | 106876403 A | 6/2017 |
| CN | 107731823 A | 2/2018 |
| WO | WO-2019/037509 A1 | 2/2019 |

* cited by examiner

METHOD FOR FORMING GATE STRUCTURE OF THREE-DIMENSIONAL MEMORY DEVICE

CROSS-REFERENCE TO RELATED APPLICATIONS

This application claims priority to PCT/CN2018/089839 filed on Jun. 4, 2018, which claims priority to Chinese Patent Application No. 201710729505.5 filed on Aug. 23, 2017, the entire contents of which are incorporated herein by reference.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

BRIEF SUMMARY

Embodiments of method for forming gate structures of 3D memory devices and fabrication methods thereof are disclosed herein.

Disclosed is a method for forming a three-dimensional (3D) NAND memory device, comprising: forming, on a substrate, an alternating dielectric stack including a plurality of dielectric layer pairs, each of the plurality of dielectric layer pairs comprising a first dielectric layer and a second dielectric layer different from the first dielectric layer; forming a plurality of slits, each penetrating vertically through the alternating dielectric stack and extending in a horizontal direction; removing the plurality of second dielectric layers in the alternating dielectric stack through the plurality of slits to form a plurality of trenches; forming a conductive layer in each of the plurality of trenches; forming a first isolation layer on sidewalls of the plurality of slits to cover the conductive layers to prevent the conductive layers from being oxidized; forming a second isolation layer on surfaces of the first isolation layer, a material of the second isolation layer being different from a material of the first isolation layer; and depositing a conductive material into the slits to form a plurality of conductive walls, wherein the plurality of conductive walls are insulated from the conductive layers.

In some embodiments, each of the plurality of dielectric layer pairs is formed of a silicon oxide layer having a thickness in a range from about 10 nm to about 150 nm and a silicon nitride layer having a thickness in a range from about 10 nm to about 150 nm.

In some embodiments, the method further comprises: forming a plurality of channel structures, each penetrating vertically through the alternating dielectric stack; wherein each of the plurality of slits extends horizontally between the plurality of channel structures.

In some embodiments, the method further comprises: after forming the plurality of slits, forming a plurality of doped regions below the slits in the substrate, so as to contact each conductive wall with a corresponding doped region.

In some embodiments, the method further comprises: forming a film including silicon, silicon nitride, silicon oxynitride, or aluminum oxide as the first isolation layer, a thickness of the film being in a range from about 0.1 nm to about 10 nm.

In some embodiments, the method further comprises: forming a silicon film as the first isolation layer; forming a silicon oxide film as the second isolation layer and; and oxidizing at least a portion of the silicon film to silicon oxide during forming the second isolation layer.

In some embodiments, forming the plurality of channel structures comprises: forming a channel hole extending vertically through the alternating dielectric stack; forming a functional layer on a sidewall of the channel hole; and forming a channel layer covering a sidewall of the functional layer.

In some embodiments, forming the functional layer comprises: forming a barrier layer on the sidewall of the channel hole for blocking an outflow of the electronic charges; forming a storage layer on the surface of the barrier layer for storing electronic charges during operation of the 3D memory device; and forming a tunneling layer on the surface of the storage layer for tunneling electronic charges.

In some embodiments, the method further comprises: before forming the conductive layer in the plurality of trenches, forming an insulating layer in the plurality of trenches.

In some embodiments, forming the insulating layer comprises: forming a first insulating sub-layer covering top surfaces and bottom surfaces of the plurality of first dielectric layers, and outside sidewall portions of functional layers that are exposed by the plurality of trenches; and forming a second insulating sub-layer having a thickness in a range from about 1 nm to about 10 nm to cover the first insulating sub-layer.

In some embodiments, the first insulating sub-layer is formed by depositing a first material including aluminum oxide; and the second insulating sub-layer is formed by depositing a second material including titanium nitride.

In some embodiments, the method further comprises: before forming the insulating layer, performing a phosphoric acid rinsing process to clean the plurality of trenches, wherein a rinsing temperature of the phosphoric acid rinsing process is in a range from about 100° C. to about 200° C., and a rinsing time of the phosphoric acid rinsing process is in a range from about 10 minutes to about 100 minutes.

In some embodiments, forming the conductive layer comprises: filling the plurality of trenches with a conductive material; and removing portions of the conductive material to form a plurality of separated gates, each of the plurality of separated gates being locating in a corresponding trench.

In some embodiments, forming the first isolation layer comprises: performing a polyatomic layer chemical vapor deposition process or an atomic layer deposition process to form first isolation layer.

In some embodiments, forming the first isolation layer comprises: forming the first isolation layer to cover the sidewalls of the plurality of slits, exposed surfaces of the insulating layer, and exposed surfaces of the conductive layers.

In some embodiments, forming the first isolation layer comprises: forming the first isolation layer having a plurality of recesses, each corresponding to a separated gate.

In some embodiments, forming the alternating dielectric stack comprises: forming the alternating dielectric stack having a thickness larger than 1000 nm in a vertical direction.

In some embodiments, forming the plurality of conductive walls comprises: depositing a material including tungsten into the plurality of slits to form the plurality of conductive walls.

Another aspect of the present disclosure provides a three-dimensional (3D) NAND memory device, comprising: an alternating dielectric/conductive stack including a plurality of dielectric/conductive layer pairs on a substrate, each of the plurality of dielectric/conductive layer pairs comprising a dielectric layer and a conductive layer; a plurality of slits, each penetrating vertically through the alternating dielectric/conductive stack and extending in a horizontal direction; a first isolation layer on sidewalls of the plurality of slits to cover the conductive layers to prevent the conductive layers from being oxidized; a second isolation layer on surfaces of the first isolation layer, a material of the second isolation layer being different from a material of the first isolation layer; and a conductive wall sandwiched by the second isolation layer in each slit, wherein the conductive wall is insulated from the conductive layers of the alternating dielectric/conductive stack.

In some embodiments, each of the dielectric layer is a silicon oxide layer having a thickness in a range from about 10 nm to about 150 nm; each of the conductive layer is a tungsten layer having a thickness in a range from about 10 nm to about 150 nm; and the conductive wall includes tungsten.

In some embodiments, the device further comprises: a plurality of channel structures, each penetrating vertically through the alternating dielectric/conductive stack; wherein each of the plurality of slits extends horizontally between the plurality of channel structures.

In some embodiments, the device further comprises: a plurality of doped regions below the slits in the substrate, wherein the conductive wall is in contact with a corresponding doped region in each slit.

In some embodiments, the first isolation layer is a film including silicon, silicon nitride, silicon oxynitride, or aluminum oxide; and the second isolation layer is a silicon oxide film.

In some embodiments, a thickness of the first isolation layer is in a range from about 0.1 nm to about 10 nm.

In some embodiments, each of the plurality of channel structures comprises: a channel hole extending vertically through the alternating dielectric/conductive stack; a functional layer on a sidewall of the channel hole; and a channel layer covering a sidewall of the functional layer.

In some embodiments, the functional layer comprises: a barrier layer on the sidewall of the channel hole configured to block an outflow of the electronic charges; a storage layer on the surface of the barrier layer configured to store electronic charges during operation of the 3D memory device; and a tunneling layer on the surface of the storage layer configured to tunnel electronic charges.

In some embodiments, the device further comprises: an insulating layer between the each dielectric layer and each conductive layer.

In some embodiments, the insulating layer is between the conductive layers and the functional layer.

In some embodiments, the insulating layer comprises: a first insulating sub-layer covering top surfaces and bottom surfaces of the plurality of dielectric layers, and outside sidewall portions of functional layer; and a second insulating sub-layer covering the first insulating sub-layer and having a thickness in a range from about 1 nm to about 10 nm.

In some embodiments, the first insulating sub-layer includes aluminum oxide; and the second insulating sub-layer includes titanium nitride.

In some embodiments, the first isolation layer having a plurality of recesses, each corresponding to a conductive layer sandwiched between two dielectric layers.

In some embodiments, the alternating dielectric/conductive stack has at least 64 dielectric/conductive layer pairs and has a thickness larger than 1000 nm in a vertical direction.

Other aspects of the present disclosure can be understood by those skilled in the art in light of the description, the claims, and the drawings of the present disclosure.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
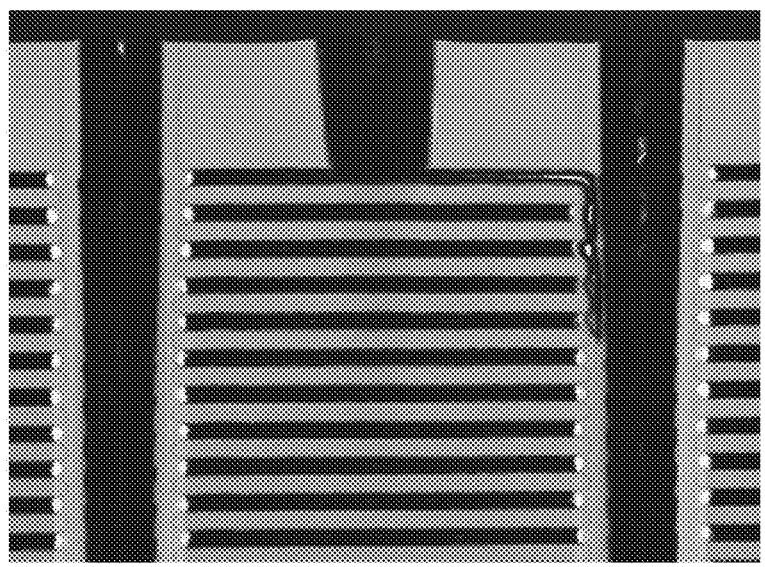
FIG. 1 illustrates a schematic cross-sectional view of an exemplary 3D memory device according to some fabricating methods.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

Various embodiments in accordance with the present disclosure provide a gate-last process for forming a gate structure of a 3D memory device. In the disclosed method, after forming a multi-layer gate structure, and before forming an isolation layer (e.g. a silicon oxide layer) on the sidewall of slits, an additional isolation layer (e.g. a silicon film) can be formed to cover the exposed surfaces of the multi-layer gate structure to prevent the exposed surfaces of the multi-layer gate structure from being oxidized during the deposition of the silicon oxide layer. As such, a leakage between the multi-layer gate structure and conductive wall in the slit can be eliminated.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnection layer can include one or more conductor and contact layers (in which contacts, interconnect lines, and/or vias are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically-oriented strings of memory cell transistors (i.e., region herein as "memory strings," such as NAND strings) on a laterally-oriented substrate so that the memory strings extend in the vertical direction with respect to the substrate. As used herein, the term "vertical/vertically" means nominally perpendicular to a lateral surface of a substrate.

FIG. 1 illustrates a schematic cross-sectional view of an exemplary 3D memory device according to some fabricating methods. In some fabricating methods, the gate-last process can include depositing multiple silicon nitride layers as dummy gate layers. Multiple silicon oxide layers are formed to isolate the multiple dummy gate layers. Multiple silts are formed by an etching process. Multiple horizontal trenches are formed by etching the multiple silicon nitride layers to remove dummy gate layers. A multi-layer gate structure is formed by a metal depositing process. A further etching process is performed to separate multiple metal gates. A silicon oxide layer is formed on the sidewalls of the multiple slits. And a metal wall is disposed as an array common source (ACS) in each slit, and metal contacts are formed.

In some fabricating methods, the metal gates are easily oxidized to generate metal whiskers during subsequent deposition processes for forming silicon oxide layers. As shown in FIG. 1, the generated metal whisker 110 can grow close to the silicon oxide layer on the sidewall of the ACS, or even penetrate the silicon oxide layer on the sidewall of the ACS, causing leakage between the metal gates and the metal wall in the slit. That is, the existing fabricating methods may result in product failure.

Accordingly, the present disclosure provides a gate-last process for forming a gate structure of a 3D memory device. In the disclosed gate-last process, a silicon film with a moderate thickness can be formed between the metal gates and the silicon oxide layer on the sidewall of the slits. The silicon film can act as a protective layer to effectively prevent the metal gates from being oxidized to whiskers and directly contacting with the metal wall in the slit, so as to ensure the normal function of the product.

Figure 2:
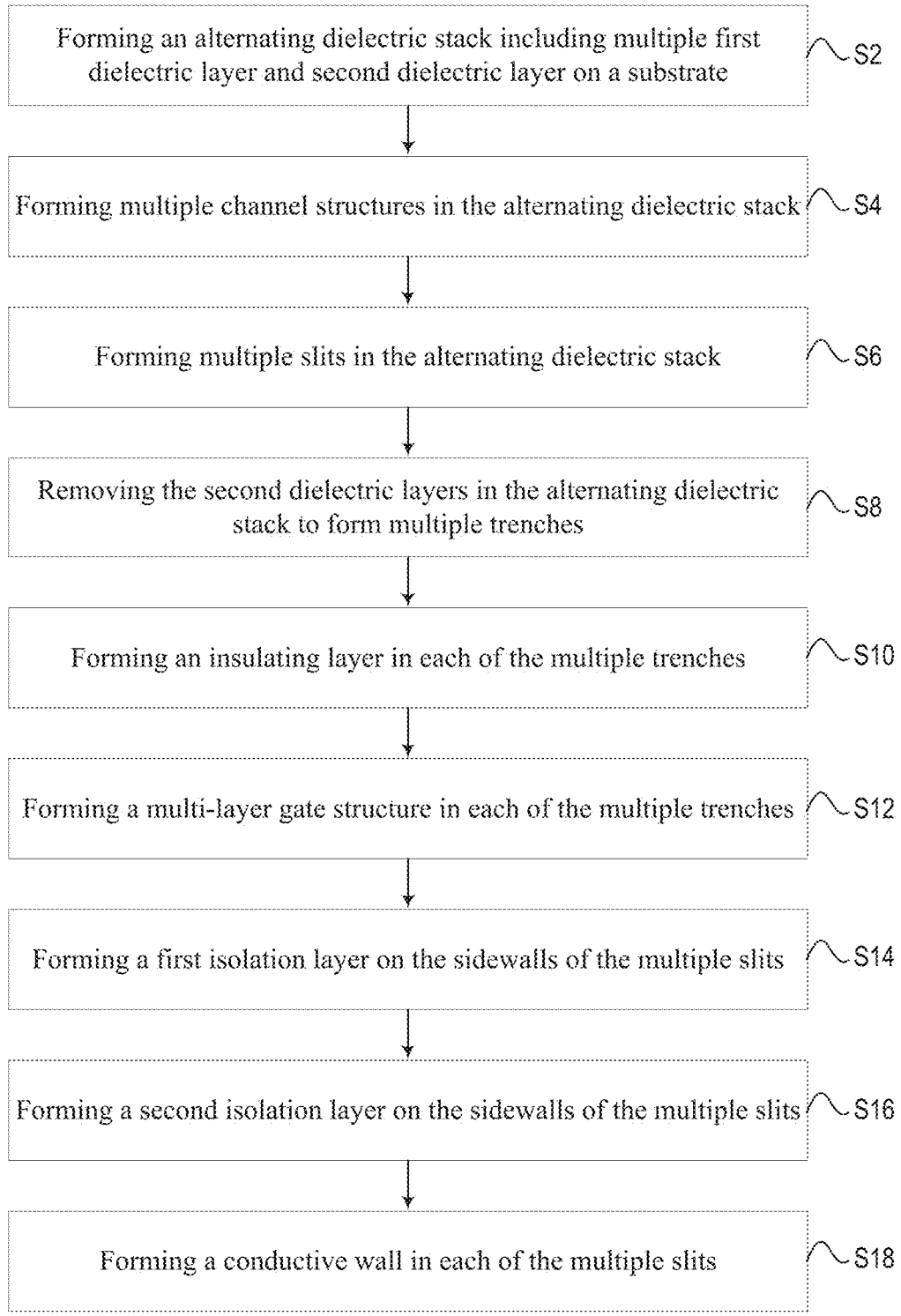
FIG. 2 illustrates a flow diagram of an exemplary method for forming a gate structure of a 3D memory device, according to some embodiments of the present disclosure.

FIG. 2 illustrates a flow diagram of an exemplary method for forming a gate structure of a 3D memory device, according to some embodiments of the present disclosure. FIGS. 3A-3G illustrate schematic cross-sectional views of an exemplary 3D memory device at certain fabricating stages of the method shown in FIG. 2 according to some embodiments of the present disclosure.

As shown in FIG. 2, the method starts at operation S2, in which an alternating dielectric stack is formed on a substrate. In some embodiments, the substrate can be any suitable semiconductor substrate having any suitable structure, such as a monocrystalline single-layer substrate, a polycrystalline silicon (polysilicon) single-layer substrate, a polysilicon and metal multi-layer substrate, etc.

Figure 3A:
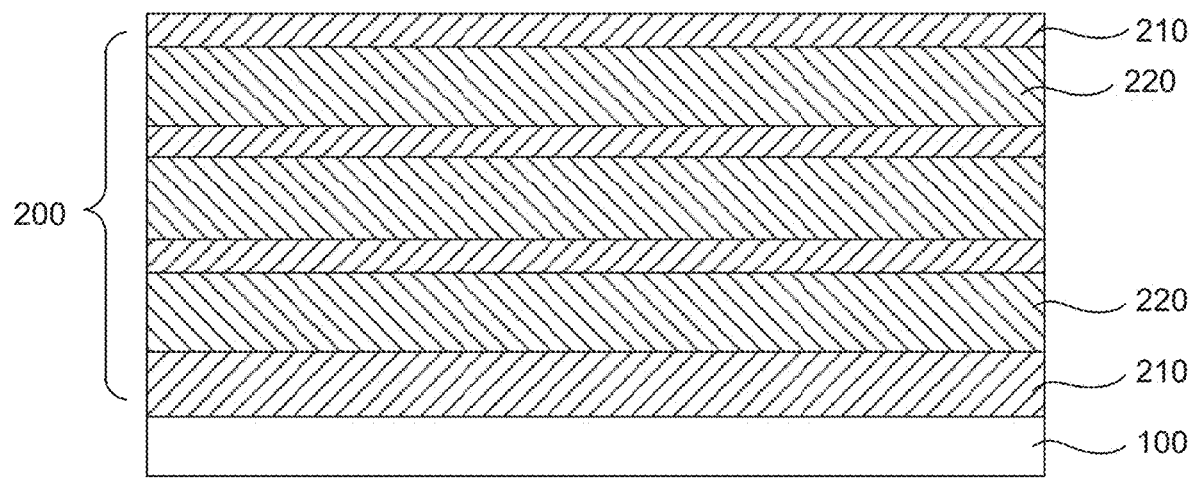
FIGS. 3A-3G illustrate schematic cross-sectional views of an exemplary 3D memory device at certain fabricating stages of the method shown in FIG. 2 according to some embodiments of the present disclosure.

As shown in FIG. 3A, an alternating dielectric stack 200 including a plurality of dielectric layer pairs can be formed on the substrate 100. Each dielectric layer pairs of the alternating dielectric stack 200 can include an alternating stack of a first dielectric layer 210 and a second dielectric layer 220 that is different from first dielectric layer 210. In some embodiments, the first dielectric layers 210 can be used as insulating layers, and the second dielectric layer 220 can be used as sacrificial layers, which are to be removed in the subsequent processes.

The plurality of first dielectric layers 210 and second dielectric layers 220 are extended in a lateral direction that is parallel to a surface of the substrate 100. In some embodiments, there are more layers than the dielectric layer pairs made of different materials and with different thicknesses in the alternating dielectric stack 200. The alternating dielectric stack 200 can be formed by one or more thin film deposition processes including, but not limited to, Chemical Vapor Deposition (CVD), Physical Vapor Deposition (PVD), Atomic Layer Deposition (ALD), or any combination thereof In some embodiments, the alternating dielectric stack 200 can include a plurality of oxide/nitride layer pairs. Each dielectric layer pair includes a layer of silicon oxide 210 and a layer of silicon nitride 220. The plurality of oxide/nitride layer pairs are also referred to herein as an "alternating oxide/nitride stack." That is, in the alternating dielectric stack 200, multiple oxide layers 210 and multiple nitride layers 220 alternate in a vertical direction. In other words, except a top and a bottom layer of a given alternating oxide/nitride stack, each of the other oxide layers 210 can be sandwiched by two adjacent nitride layers 220, and each of the nitride layers 220 can be sandwiched by two adjacent oxide layers 210.

Oxide layers 210 can each have the same thickness or have different thicknesses. For example, a thickness of each oxide layer can be in a range from about 10 nm to about 150 nm. Similarly, nitride layers 220 can each have the same thickness or have different thicknesses. For example, a thickness of each nitride layer can be in a range from about 10 nm to about 150 nm. In some embodiments, a total thickness of the alternating dielectric stack 200 can be larger than 1000 nm.

It is noted that, in the present disclosure, the oxide layers 210 and/or nitride layers 220 can include any suitable oxide materials and/or nitride materials. For example, the element of the oxide materials and/or nitride materials can include, but not limited to, tungsten (W), cobalt (Co), copper (Cu), aluminum (Al), doped silicon, silicides, or any combination thereof. In some embodiments, the oxide layers can be silicon oxide layers, and the nitride layers can be silicon nitride layer.

The alternating dielectric stack 200 can include any suitable number of layers of the oxide layers 210 and the nitride layers 220. In some embodiments, a total number of layers of the oxide layers 210 and the nitride layers 220 in the alternating dielectric stack 200 is equal to or larger than 64. That is, a number of oxide/nitride layer pairs can be equal to or larger than 32. In some embodiments, alternating oxide/nitride stack includes more oxide layers or more nitride layers with different materials and/or thicknesses than the oxide/nitride layer pair. For example, a bottom layer and a top layer in the alternating dielectric stack 200 can be oxide layers 210.

As shown in FIG. 2, the method proceeds to operation S4, in which multiple channel structures can be formed in the alternating dielectric stack. Each channel structure can include a channel hole 300 extending vertically through the alternating dielectric stack 200, a functional layer 310 on the sidewall of the channel hole 300, and a channel layer 320 between the functional layer and a filling structure 330. The multiple channel structures can be arranged as an array in the alternating dielectric stack 200. For example, a number of the multiple channel structures can be $1, 2^2, 3^2, \ldots, (1+n)^2$, where n is an integer large than 1.

In some embodiments, fabrication processes to form the channel structure include forming a channel hole 300 that extends vertically through the alternating dielectric stack 200. The channel hole 300 can have a high aspect ratio, and can be formed by etching the alternating dielectric stack 200, and a subsequent cleaning process. The etching process to form the channel hole 300 can be a wet etching, a dry etching, or a combination thereof In some embodiments, fabrication processes to form a functional layer 310 on the sidewall of the channel hole 300. The functional layer can be a composite dielectric layer, such as a combination of a barrier layer 312, a storage layer 314, and a tunneling layer 316. The functional layer 310, including the barrier layer 312, the storage layer 314, and the tunneling layer 316, can be formed by one or more thin film deposition processes, such as ALD, CVD, PVD, any other suitable processes, or any combination thereof.

Figure 3B:
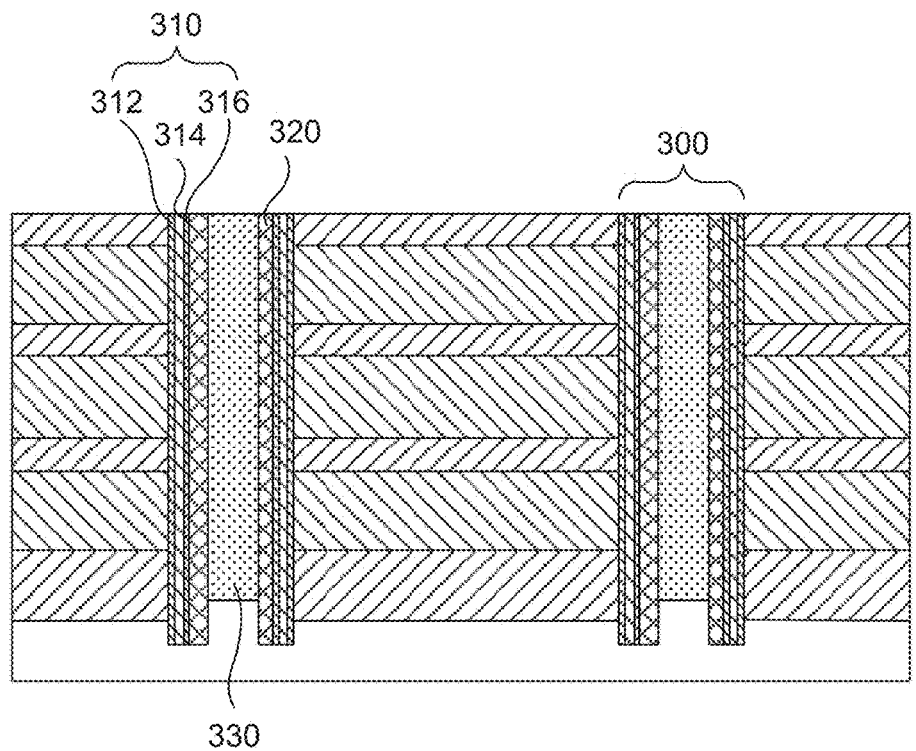

As shown in FIG. 3B, the barrier layer 312 can be formed between the storage layer 314 and the sidewall of the channel hole 300. The barrier layer 213 can be used for blocking the outflow of the electronic charges. In some embodiments, the barrier layer 312 can be a silicon oxide layer or a combination of silicon oxide/silicon nitride/silicon oxide (ONO) layers. In some embodiments, the barrier layer 312 includes high dielectric constant (high-k) dielectrics (e.g., aluminum oxide). In some embodiments, a thickness of the barrier layer 312 can be in a range from about 3 nm to about 20 nm.

The storage layer 314 can be formed between the tunneling layer 316 and the barrier layer 312. Electrons or holes from the channel layer can tunnel to the storage layer 314 through the tunneling layer 316. The storage layer 314 can be used for storing electronic charges (electrons or holes) for memory operation. The storage or removal of charge in the storage layer 314 can impact the on/off state and/or a conductance of the semiconductor channel. The storage layer 314 can include one or more films of materials including, but are not limited to, silicon nitride, silicon oxynitride, a combination of silicon oxide and silicon nitride, or any combination thereof. In some embodiments, the storage layer 314 can include a nitride layer formed by using one or more deposition processes. In some embodiments, a thickness of the storage layer 314 can be in a range from about 3 nm to about 20 nm.

The tunneling layer 316 can be formed on the sidewall of the storage layer 314. The tunneling layer 316 can be used for tunneling electronic charges (electrons or holes). The tunneling layer 316 can include dielectric materials including, but not limited to, silicon oxide, silicon nitride, silicon oxynitride, or any combination thereof. In some embodiments, the tunneling layer 130 can be an oxide layer formed by using a deposition process. In some embodiments, a thickness of the tunneling layer 316 can be in a range from about 3 nm to about 20 nm.

In some embodiments, fabrication processes to form the channel structure further include forming a channel layer 320 covering the sidewall of the functional layer 310. In some embodiments, the channel layer 320 can be an amorphous silicon layer or a polysilicon layer formed by using a thin film deposition process, such as ALD, CVD, PVD, or any other suitable process. In some embodiments, a thickness of the channel layer 320 can be in a range from about 5 nm to 20 nm.

In some embodiments, fabrication processes to form the channel structure further include forming a filling structure 330 to cover the channel layer 320 and fill the channel hole 310. In some embodiments, the filling structure 330 can be an oxide layer formed by using any suitable deposition process, such as ALD, CVD, PVD, etc. In some embodiments, the filling structure 330 can include one or more airgaps.

Figure 3C:
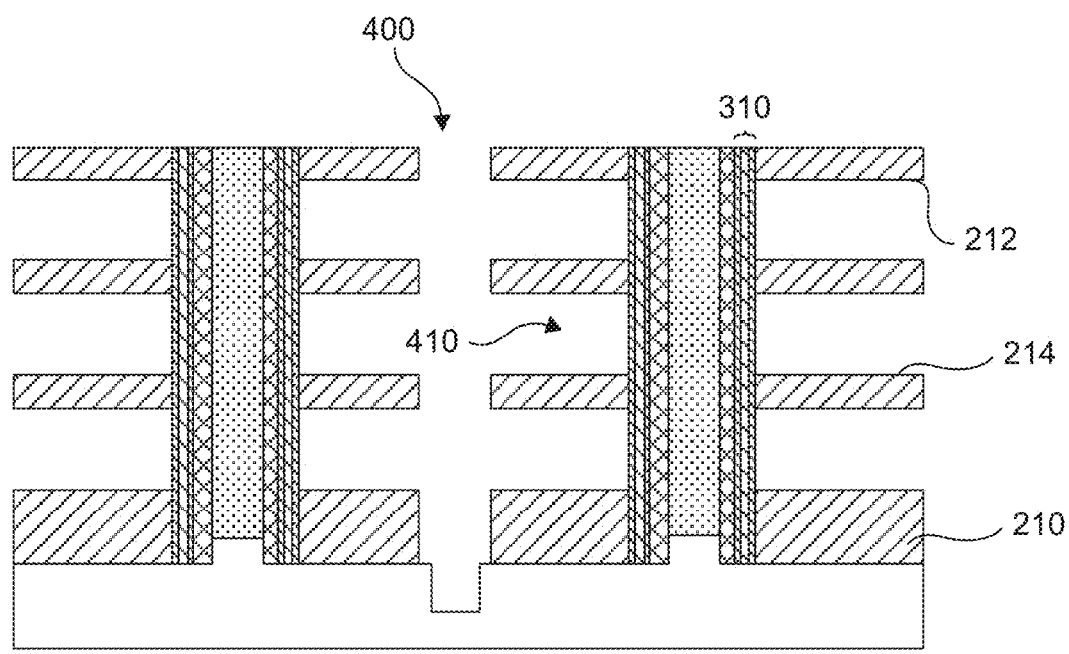

As shown in FIG. 2, the method proceeds to operation S6, in which multiple slits can be formed in the alternating dielectric stack. As shown in FIG. 3C, each slit 400 can vertically penetrate through the alternating dielectric stack 200, and extend substantially in a straight line between two arrays of channel structures. The multiple slits 400 can be formed by forming a mask layer over the alternating dielectric stack 200 and patterning the mask using, e.g., photolithography, to form openings corresponding to the multiple slits in the patterned mask layer. A suitable etching process, e.g., dry etch and/or wet etch, can be performed to remove portions of the alternating dielectric stack 200 exposed by the openings until the multiple expose the substrate 100. The mask layer can be removed after the formation of the multiple slits.

As shown in FIG. 2, the method proceeds to operation S8, in which the second dielectric layers 220 in the alternating dielectric stack 200 can be removed to form multiple trenches 410. The multiple trenches 410 can extend in a horizontal direction, and can be used as spaces for a multi-layer gate structure to be formed in the subsequent processes. It is noted that, the term "horizontal/horizontally" used herein means nominally parallel to a lateral surface of a substrate As described above, the second dielectric layers 220 in the alternating dielectric stack 200 are used as sacrificial layers, and are removed by used any suitable etching process, e.g., an isotropic dry etch or a wet etch. The etching process can have sufficiently high etching selectivity of the material of the second dielectric layers 220 over the materials of the first dielectric layer 210, such that the etching process can have minimal impact on the first dielectric layer 210. The isotropic dry etch and/or the wet etch can remove second dielectric layers 220 in various directions to expose the top and bottom surfaces of each first dielectric layer 210. As such, multiple horizontal trenches 410 can then be formed between first dielectric layers 210.

In some embodiments, the second dielectric layers 220 include silicon nitride and the etchant of the isotropic dry etch includes one or more of $CF_4$, $CHF_3$, $C4F_8$, $C4F_6$, and $CH_2F_2$. The radio frequency (RF) power of the isotropic dry etch can be lower than about 100 W and the bias can be lower than about 10V. In some embodiments, the second dielectric layers 220 include silicon nitride and the etchant of the wet etch includes phosphoric acid.

After the second dielectric layers 220 are removed, the multiple slits 400 and multiple trenches 410 can be cleaned by using any suitable cleaning process. For example, a phosphoric acid rinsing process can be performed to remove the impurities on the inner wall of the trenches 410. In some embodiments, a rinsing temperature can be in a range from about 100° C. to about 200° C., and a rinsing time can be in a range from about 10 minutes to about 100 minutes. After the cleaning process, the top surfaces 212 and bottom surfaces 214 of the first dielectric layers 210, and the outside sidewall portions of functional layers 310 originally surrounded by the second dielectric layers 220 can be exposed through the multiple trenches 410.

As shown in FIG. 2, the method proceeds to operation S10, in which an insulating layer can be formed in each of the multiple trenches 410. The insulating layer can be used as a gate dielectric layer for insulating the respective word line (i.e., gate electrode) formed in the subsequent processes from the adjacent first dielectric layer 212.

In some embodiments, the insulating layer can be formed by filling the horizontal trenches 410 as shown in FIG. 3C with one or more suitable insulating materials. For example, one or more suitable deposition processes, such as CVD, PVD, and/or ALD, can be utilized to deposit the one or more insulating materials into the horizontal trenches 410. In some embodiments, a recess etch and/or a chemical-mechanical planarization (CMP) can be used to remove excessive insulating material(s) outside of the multiple trenches 410.

The one or more insulating materials can include any suitable materials that provide electric insulating function. For example, the one or more insulating materials can include silicon oxide, silicon nitride, silicon oxynitride, aluminum oxide, titanium nitride, etc., and/or any suitable combinations thereof. In some embodiments, multiple insulating layers can have different insulating materials.

Figure 3D:
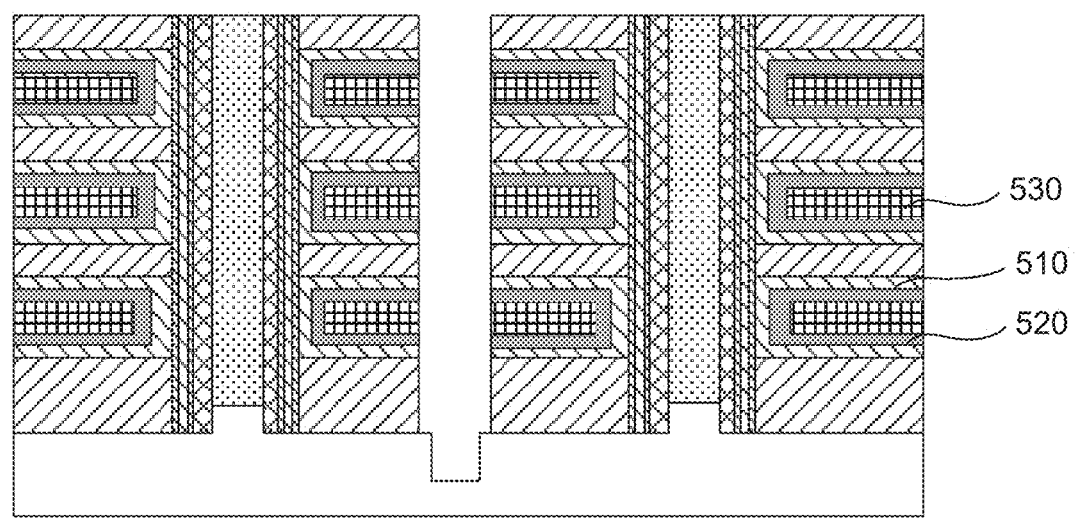

In some embodiments, the insulating layer can have a laminated structure. For example, as shown in FIG. 3D, the insulating layer can include a first insulating sub-layer 510 covering the top surfaces 212 and bottom surfaces 214 of the first dielectric layers 210, and the outside sidewall portions of functional layers 310 that are exposed by the multiple trenches 410. The insulating layer can further include a second insulating sub-layer 520 covering the surfaces of the first insulating sub-layer 510. In some embodiments, the first insulating sub-layer 510 can include high dielectric constant (high-k) dielectrics (e.g., aluminum oxide), and the second insulating sub-layer 520 can include titanium nitride as a glue layer to prevent following gate electrode layers from peeling.

In some other embodiments, the insulating layer can be a single film structure. For example, the insulating layer can include a single high-k dielectric layer (e.g., titanium nitride film) covering the top surfaces 212 and bottom surfaces 214 of the first dielectric layers 210, and the outside sidewall portions of functional layers 310 that are exposed by the multiple trenches 410. A thickness of the titanium nitride film can be in a range from about 1 nm to about 10 nm.

As shown in FIG. 2, the method proceeds to operation S12, in which a multi-layer gate structure can be formed in the multiple trenches 410. The multi-layer gate structure can be formed by filling the horizontal trenches 230 with a suitable gate electrode metal material. As shown in FIG. 3D, the gate electrode metal material can fill each horizontal trench 410 to form a conductive layer 530 covering the insulating layer. The conductive layers 530 can provide the base material for the subsequently-formed word lines (i.e., gate electrodes).

The gate electrode metal material can include any suitable conductive material, e.g., tungsten, aluminum, copper, cobalt, or any combination thereof, for forming the word lines (i.e., gate electrodes). The gate electrode material can be deposited into horizontal trenches 230 using a suitable deposition method such as CVD, physical vapor deposition (PVD), plasma-enhanced CVD (PECVD), sputtering, metal-organic chemical vapor deposition (MOCVD), and/or ALD. In some embodiments, the conductive layers 530 include tungsten formed by CVD.

Figure 3E:
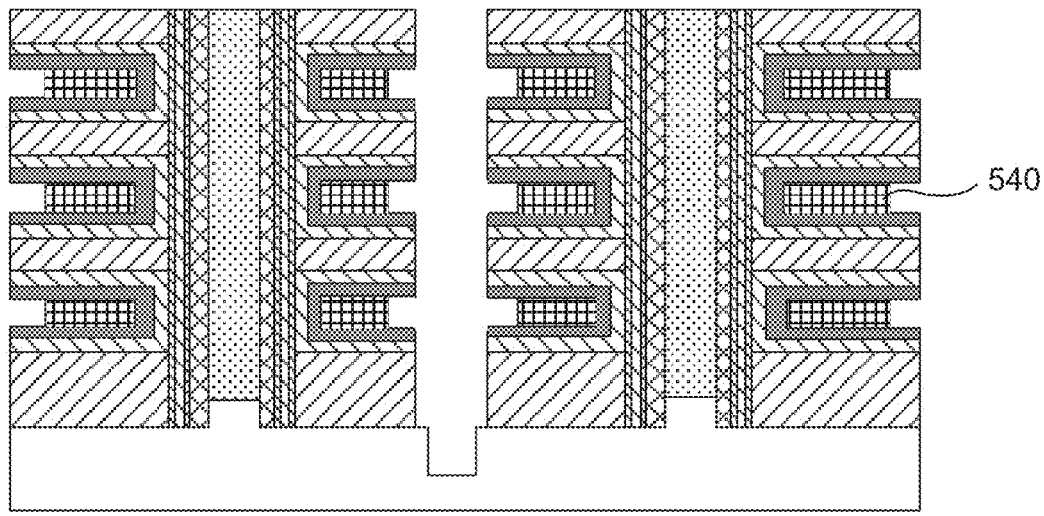

In some embodiments, after forming the multiple conductive layers 530, portions of the multiple conductive layers 530 can be removed. In some embodiments, in order to ensure the insulation between multiple gates, a recess etch can be performed to remove the portions of the multiple conductive layers 530 that are outside the multiple trenches 410 and close to the multiple slits 400. In doing so, a recess of the conductive layer 530 can be formed in each trench 410, as shown in FIG. 3E. The remaining portions of the multiple conductive layers 530 can form the multi-layer gate structure, which includes multiple gates 540 each being sandwiched by the insulating layer.

Figure 3F:
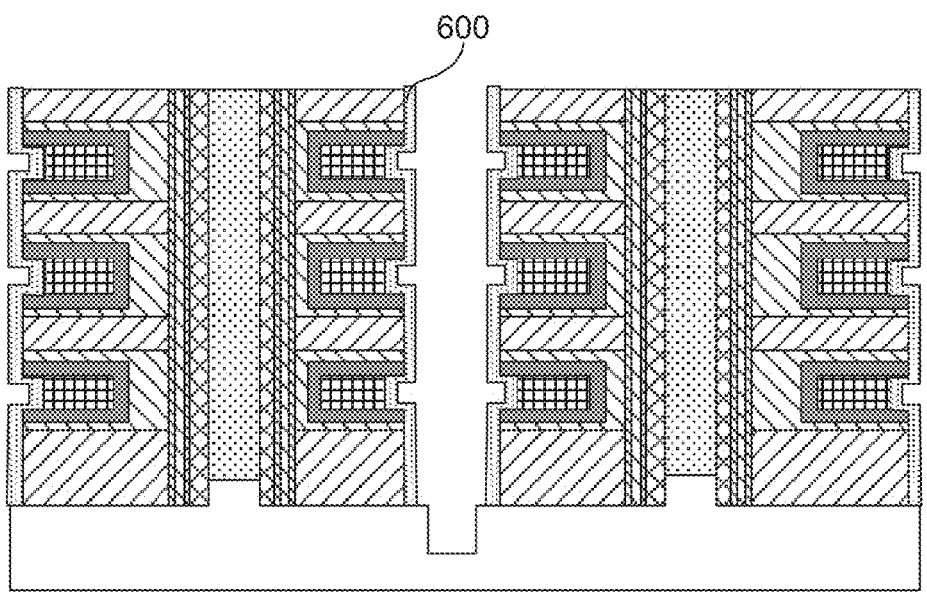

As shown in FIG. 2, the method proceeds to operation S14, in which a first isolation layer can be formed on the sidewalls of the multiple slits 400. As shown in FIG. 3F, the first isolation layer 600 can cover the sidewall of the slit 400, the exposed surfaces of the insulating layer, and the exposed surfaces of the multiple gates 540. The first isolation layer 600 can be used to prevent the multiple gates 540 from being oxidized in the subsequent processes. In some embodiments, a thickness of the first isolation layer 600 can be in a range from about 0.1 nm to about 10 nm.

The first isolation layer 600 can be formed by depositing a material including, but not limited to, silicon (e.g., polycrystalline silicon, monocrystalline silicon, or amorphous silicon), silicon nitride, silicon oxynitride, aluminum oxide, and/or any combination thereof. The depositing process can be CVD, sputtering, PVD, MOCVD, Low pressure chemical vapor deposition (LPCVD), polyatomic layer chemical vapor deposition (PLCVD), and/or ALD. Since the first isolation layer 600 is formed after the recess etching process of the multiple conductive layers and has a comparatively small thickness, the first isolation layer 600 also include multiple recesses corresponding to the multiple gates 540, as shown in FIG. 3F.

Figure 3G:
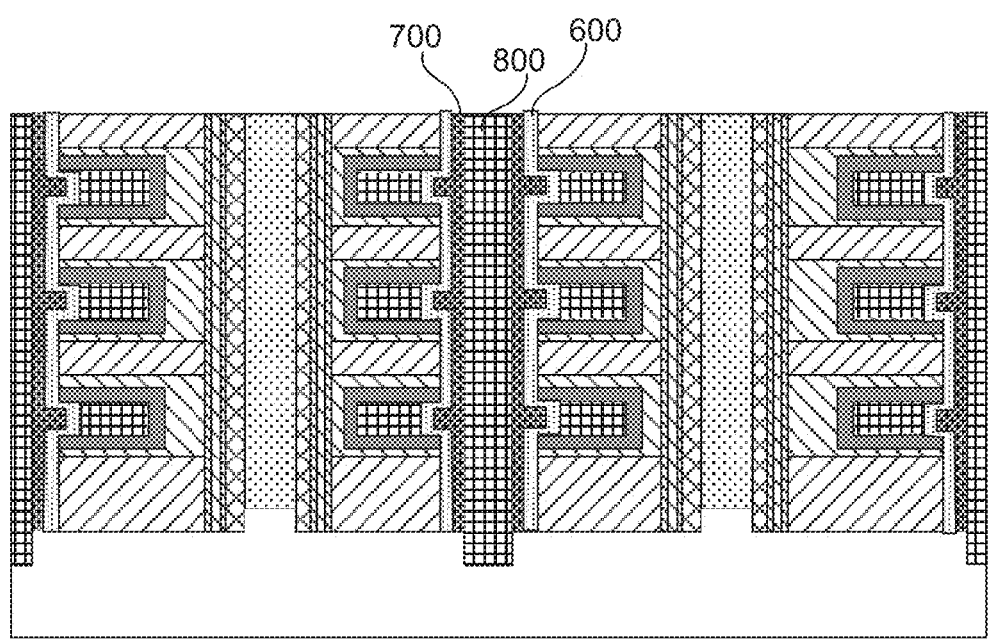

As shown in FIG. 2, the method proceeds to operation S16, in which a second isolation layer can be formed on the sidewalls of the multiple slits 400. As shown in FIG. 3G, the second isolation layer 700 can cover the first isolation layer 600. The second isolation layer 700 can be used to provide electrical insulation between the multiple gates 540 and conductive walls 800 formed in the subsequent process. The second isolation layer 700 can be formed by a suitable deposition process and a following etching process. For example, a deposition process, such as sputtering, PVD, MOCVD, Low pressure chemical vapor deposition (LPCVD), and/or ALD, etc., can be performed to form the second isolation layer 700. A material of the second isolation layer 700 can include any suitable insulating material that is different from the material of the first isolation layer 600, such as silicon oxide, etc.

It is noted that, in one embodiment, the first isolation layer 600 is a silicon film and the second isolation layer 700 is a silicon oxide film. In such case, during the deposition process to form the silicon oxide film, portions of or all of the silicon film can be oxidized to silicon oxide. Thus, portions of or all of the first isolation layer 600 can be converted to the second isolation layer 700. That is, the formed silicon oxide layer can cover the sidewall of each slit 400, surfaces of the insulating layer and the metal gate in each trench 410.

After the first isolation layer 600 and the second isolation layer 700 are formed, an etching process can be performed to remove portions of the first isolation layer 600 and the second isolation layer 700 at the bottom of each slit 400 to expose the substrate 100. As such, second isolation layer 700 can be formed on the sidewalls of the multiple slits 400.

As shown in FIG. 2, the method proceeds to operation S18, in which a conductive wall can be formed in each of the multiple slits 400. As shown in FIG. 3G, the conductive wall 800 can be sandwiched between second isolation layers 700 in each slit 400. In some embodiments, the conductive wall 800 can be formed by depositing any suitable conductive material, such as metal materials including tungsten, aluminum, copper, polysilicon, silicides, and/or combinations thereof, etc. The conductive material can be deposited into slits 400 using a suitable deposition method such as CVD, physical vapor deposition (PVD), plasma-enhanced CVD (PECVD), sputtering, metal-organic chemical vapor deposition (MOCVD), and/or ALD. In some embodiments, the conductive walls 800 include tungsten formed by CVD.

In some embodiments, before forming the conductive walls 800, doped regions (not shown in figures) can be formed in the substrate 100 under each slit 400 by, for example, ion implantation and/or thermal diffusion through the slits 400. After forming the multiple conductive walls, the lower end of each conductive wall 800 can be in contact with a corresponding doped region. It is understood that doped regions can be formed in an earlier fabrication stage, for example, prior to the formation of the multi-layer gate structure, according to some embodiments.

Accordingly, a method for forming a gate structure of a 3D memory device is provided in some embodiments in accordance with the present disclosure. In the disclosed method, after forming a multi-layer gate structure, and before forming a silicon oxide layer on the sidewall of slits, a silicon film can be formed to cover the exposed surfaces of the multi-layer gate structure to prevent the exposed surfaces of the multi-layer gate structure from being oxidized during the deposition of the silicon oxide layer. As such, a leakage between the multi-layer gate structure and conductive wall in the slit can be eliminated, and a product yield of the 3D memory devices can be improved.

The method for forming a gate structure of a 3D memory device can comprise: forming, on a substrate, an alternating dielectric stack including a plurality of dielectric layer pairs, each of the plurality of dielectric layer pairs comprising a first dielectric layer and a second dielectric layer different from the first dielectric layer; forming a plurality of slits, each penetrating vertically through the alternating dielectric stack and extending in a horizontal direction; removing the plurality of second dielectric layers in the alternating dielectric stack through the plurality of slits to form a plurality of trenches; forming a conductive layer in each of the plurality of trenches; forming a first isolation layer on sidewalls of the plurality of slits to cover the conductive layers to prevent the conductive layers from being oxidized; forming a second isolation layer on surfaces of the first isolation layer, a material of the second isolation layer being different from a material of the first isolation layer; and depositing a conductive material into the slits to form a plurality of conductive walls, wherein the plurality of conductive walls are insulated from the conductive layers.

In some embodiments, each of the plurality of dielectric layer pairs is formed of a silicon oxide layer having a thickness in a range from about 10 nm to about 150 nm and a silicon nitride layer having a thickness in a range from about 10 nm to about 150 nm.

In some embodiments, the method further comprises: forming a plurality of channel structures, each penetrating vertically through the alternating dielectric stack; wherein each of the plurality of slits extends horizontally between the plurality of channel structures.

In some embodiments, the method further comprises: after forming the plurality of slits, forming a plurality of doped regions below the slits in the substrate, so as to contact each conductive wall with a corresponding doped region.

In some embodiments, the method further comprises: forming a film including silicon, silicon nitride, silicon oxynitride, or aluminum oxide as the first isolation layer, a thickness of the film being in a range from about 0.1 nm to about 10 nm.

In some embodiments, the method further comprises: forming a silicon film as the first isolation layer; forming a silicon oxide film as the second isolation layer and; and oxidizing at least a portion of the silicon film to silicon oxide during forming the second isolation layer.

In some embodiments, forming the plurality of channel structures comprises: forming a channel hole extending vertically through the alternating dielectric stack; forming a functional layer on a sidewall of the channel hole; and forming a channel layer covering a sidewall of the functional layer.

In some embodiments, forming the functional layer comprises: forming a barrier layer on the sidewall of the channel hole for blocking an outflow of the electronic charges; forming a storage layer on the surface of the barrier layer for storing electronic charges during operation of the 3D memory device; and forming a tunneling layer on the surface of the storage layer for tunneling electronic charges.

In some embodiments, the method further comprises: before forming the conductive layer in the plurality of trenches, forming an insulating layer in the plurality of trenches.

In some embodiments, forming the insulating layer comprises: forming a first insulating sub-layer covering top surfaces and bottom surfaces of the plurality of first dielectric layers, and outside sidewall portions of functional layers that are exposed by the plurality of trenches; and forming a second insulating sub-layer having a thickness in a range from about 1 nm to about 10 nm to cover the first insulating sub-layer.

In some embodiments, the first insulating sub-layer is formed by depositing a first material including aluminum oxide; and the second insulating sub-layer is formed by depositing a second material including titanium nitride.

In some embodiments, the method further comprises: before forming the insulating layer, performing a phosphoric acid rinsing process to clean the plurality of trenches, wherein a rinsing temperature of the phosphoric acid rinsing process is in a range from about 100° C. to about 200° C., and a rinsing time of the phosphoric acid rinsing process is in a range from about 10 minutes to about 100 minutes.

In some embodiments, forming the conductive layer comprises: filling the plurality of trenches with a conductive material; and removing portions of the conductive material to form a plurality of separated gates, each of the plurality of separated gates being locating in a corresponding trench.

In some embodiments, forming the first isolation layer comprises: performing a polyatomic layer chemical vapor deposition process or an atomic layer deposition process to form first isolation layer.

In some embodiments, forming the first isolation layer comprises: forming the first isolation layer to cover the sidewalls of the plurality of slits, exposed surfaces of the insulating layer, and exposed surfaces of the conductive layers.

In some embodiments, forming the first isolation layer comprises: forming the first isolation layer having a plurality of recesses, each corresponding to a separated gate.

In some embodiments, forming the alternating dielectric stack comprises: forming the alternating dielectric stack having a thickness larger than 1000 nm in a vertical direction.

In some embodiments, forming the plurality of conductive walls comprises: depositing a material including tungsten into the plurality of slits to form the plurality of conductive walls.

Another aspect of the present disclosure provides a three-dimensional (3D) NAND memory device, comprising: an alternating dielectric/conductive stack including a plurality of dielectric/conductive layer pairs on a substrate, each of the plurality of dielectric/conductive layer pairs comprising a dielectric layer and a conductive layer; a plurality of slits, each penetrating vertically through the alternating dielectric/conductive stack and extending in a horizontal direction; a first isolation layer on sidewalls of the plurality of slits to cover the conductive layers to prevent the conductive layers from being oxidized; a second isolation layer on surfaces of the first isolation layer, a material of the second isolation layer being different from a material of the first isolation layer; and a conductive wall sandwiched by the second isolation layer in each slit, wherein the conductive wall is insulated from the conductive layers of the alternating dielectric/conductive stack.

In some embodiments, each of the dielectric layer is a silicon oxide layer having a thickness in a range from about 10 nm to about 150 nm; each of the conductive layer is a tungsten layer having a thickness in a range from about 10 nm to about 150 nm; and the conductive wall includes tungsten.

In some embodiments, the device further comprises: a plurality of channel structures, each penetrating vertically through the alternating dielectric/conductive stack; wherein each of the plurality of slits extends horizontally between the plurality of channel structures.

In some embodiments, the device further comprises: a plurality of doped regions below the slits in the substrate, wherein the conductive wall is in contact with a corresponding doped region in each slit.

In some embodiments, the first isolation layer is a film including silicon, silicon nitride, silicon oxynitride, or aluminum oxide; and the second isolation layer is a silicon oxide film.

In some embodiments, a thickness of the first isolation layer is in a range from about 0.1 nm to about 10 nm.

In some embodiments, each of the plurality of channel structures comprises: a channel hole extending vertically through the alternating dielectric/conductive stack; a functional layer on a sidewall of the channel hole; and a channel layer covering a sidewall of the functional layer.

In some embodiments, the functional layer comprises: a barrier layer on the sidewall of the channel hole configured to block an outflow of the electronic charges; a storage layer on the surface of the barrier layer configured to store electronic charges during operation of the 3D memory device; and a tunneling layer on the surface of the storage layer configured to tunnel electronic charges.

In some embodiments, the device further comprises: an insulating layer between the each dielectric layer and each conductive layer.

In some embodiments, the insulating layer is between the conductive layers and the functional layer.

In some embodiments, the insulating layer comprises: a first insulating sub-layer covering top surfaces and bottom surfaces of the plurality of dielectric layers, and outside sidewall portions of functional layer; and a second insulating sub-layer covering the first insulating sub-layer and having a thickness in a range from about 1 nm to about 10 nm.

In some embodiments, the first insulating sub-layer includes aluminum oxide; and the second insulating sub-layer includes titanium nitride.

In some embodiments, the first isolation layer having a plurality of recesses, each corresponding to a conductive layer sandwiched between two dielectric layers.

In some embodiments, the alternating dielectric/conductive stack has at least 64 dielectric/conductive layer pairs and has a thickness larger than 1000 nm in a vertical direction.

The foregoing description of the specific embodiments will so fully reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for forming a three-dimensional (3D) NAND memory device, comprising:
   forming, on a substrate, an alternating dielectric stack including a plurality of dielectric layer pairs, each of the plurality of dielectric layer pairs comprising a first dielectric layer and a second dielectric layer different from the first dielectric layer;
   forming a plurality of slits, each penetrating vertically through the alternating dielectric stack and extending in a horizontal direction;
   removing the plurality of second dielectric layers in the alternating dielectric stack through the plurality of slits to form a plurality of trenches;
   forming a conductive layer in each of the plurality of trenches;
   forming a first isolation layer on sidewalls of the plurality of slits to cover the conductive layers to prevent the conductive layers from being oxidized;
   forming a second isolation layer on surfaces of the first isolation layer, a material of the second isolation layer being different from a material of the first isolation layer; and
   depositing a conductive material into the slits to form a plurality of conductive walls, wherein the plurality of conductive walls are insulated from the conductive layers.

2. The method of claim 1, further comprising:
   after forming the plurality of slits, forming a plurality of doped regions below the slits in the substrate, so as to contact each conductive wall with a corresponding doped region.

3. The method of claim 1, further comprising:
   forming a film including silicon, silicon nitride, silicon oxynitride, or aluminum oxide as the first isolation layer, a thickness of the film being in a range from about 0.1 nm to about 10 nm.

4. The method of claim 1, further comprising:
   forming a silicon film as the first isolation layer;
   forming a silicon oxide film as the second isolation layer and; and
   oxidizing at least a portion of the silicon film to silicon oxide during forming the second isolation layer.

5. The method of claim 1, further comprising:
   before forming the conductive layer in the plurality of trenches, forming an insulating layer in the plurality of trenches.

6. The method of claim 5, wherein forming the insulating layer comprises:
   forming a first insulating sub-layer covering top surfaces and bottom surfaces of the plurality of first dielectric layers, and outside sidewall portions of functional layers that are exposed by the plurality of trenches; and
   forming a second insulating sub-layer having a thickness in a range from about 1 nm to about 10 nm to cover the first insulating sub-layer.

7. The method of claim 6, wherein:
   the first insulating sub-layer is formed by depositing a first material including aluminum oxide; and
   the second insulating sub-layer is formed by depositing a second material including titanium nitride.

8. The method of claim 5, further comprising:
   before forming the insulating layer, performing a phosphoric acid rinsing process to clean the plurality of trenches, wherein a rinsing temperature of the phosphoric acid rinsing process is in a range from about 100° C. to about 200° C., and a rinsing time of the phosphoric acid rinsing process is in a range from about 10 minutes to about 100 minutes.

9. The method of claim 1, wherein forming the conductive layer comprises:
   filling the plurality of trenches with a conductive material; and
   removing portions of the conductive material to form a plurality of separated gates, each of the plurality of separated gates being locating in a corresponding trench.

10. The method of claim 5, wherein forming the first isolation layer comprises:
    forming the first isolation layer to cover the sidewalls of the plurality of slits, exposed surfaces of the insulating layer, and exposed surfaces of the conductive layers, wherein the first isolation layer has a plurality of recesses, each recess corresponding to a separated gate.

11. A three-dimensional (3D) NAND memory device, comprising:

an alternating dielectric/conductive stack including a plurality of dielectric/conductive layer pairs on a substrate, each of the plurality of dielectric/conductive layer pairs comprising a dielectric layer and a conductive layer;
a plurality of slits, each penetrating vertically through the alternating dielectric/conductive stack and extending in a horizontal direction;
a first isolation layer on sidewalls of the plurality of slits to cover surfaces of the conductive layers adjacent to the slits to prevent the conductive layers from being oxidized;
a second isolation layer on surfaces of the first isolation layer, a material of the second isolation layer being different from a material of the first isolation layer; and
a conductive wall sandwiched by the second isolation layer in each slit, wherein the conductive wall is insulated from the conductive layers of the alternating dielectric/conductive stack.

12. The device of claim 11, further comprising:
a plurality of doped regions below the slits in the substrate, wherein the conductive wall is in contact with a corresponding doped region in each slit.

13. The device of claim 11, wherein:
the first isolation layer is a film including silicon, silicon nitride, silicon oxynitride, or aluminum oxide; and
the second isolation layer is a silicon oxide film.

14. The device of claim 13, wherein:
a thickness of the first isolation layer is in a range from about 0.1 nm to about 10 nm.

15. The device of claim 11, wherein each of the plurality of channel structures comprises:
a channel hole extending vertically through the alternating dielectric/conductive stack;
a functional layer on a sidewall of the channel hole; and
a channel layer covering a sidewall of the functional layer.

16. The device of claim 15, wherein the functional layer comprises:
a barrier layer on the sidewall of the channel hole configured to block an outflow of the electronic charges;
a storage layer on the surface of the barrier layer configured to store electronic charges during operation of the 3D memory device; and
a tunneling layer on the surface of the storage layer configured to tunnel electronic charges.

17. The device of claim 16, further comprising:
an insulating layer between the each dielectric layer and each conductive layer.

18. The device of claim 17, wherein the insulating layer comprises:
a first insulating sub-layer covering top surfaces and bottom surfaces of the plurality of dielectric layers, and outside sidewall portions of functional layer; and
a second insulating sub-layer covering the first insulating sub-layer and having a thickness in a range from about 1 nm to about 10 nm.

19. The device of claim 18, wherein:
the first insulating sub-layer includes aluminum oxide; and
the second insulating sub-layer includes titanium nitride.

20. The device of claim 11, wherein:
the first isolation layer having a plurality of recesses, each corresponding to a conductive layer sandwiched between two dielectric layers.

* * * * *